United States Patent [19]

Bayes

[11] Patent Number: 5,108,786
[45] Date of Patent: Apr. 28, 1992

[54] METHOD OF MAKING PRINTED CIRCUIT BOARDS

[75] Inventor: Martin Bayes, Framingham, Mass.

[73] Assignee: Enthone-OMI, Inc., West Haven, Conn.

[21] Appl. No.: 617,300

[22] Filed: Nov. 20, 1990

Related U.S. Application Data

[63] Continuation of Ser. No. 345,804, May 1, 1989, abandoned.

[51] Int. Cl.⁵ ............................................. C23C 26/00
[52] U.S. Cl. ....................................... 427/98; 427/304; 427/305; 427/306; 205/126; 205/167
[58] Field of Search ................. 427/98, 306, 305, 304; 205/126, 167

[56] References Cited

U.S. PATENT DOCUMENTS

| | | | |
|---|---|---|---|
| 3,011,920 | 12/1961 | Shipley | 427/437 |
| 3,698,940 | 10/1972 | Mersereau | 427/98 |
| 4,217,182 | 8/1980 | Cross | 427/306 |
| 4,233,344 | 11/1980 | Learonal | . |
| 4,234,462 | 11/1980 | Harshaw | . |
| 4,273,804 | 6/1981 | Feldstein | 427/98 |
| 4,592,852 | 6/1986 | Enthone | . |
| 4,608,275 | 8/1986 | Kukanskis | 427/98 |
| 4,668,532 | 5/1987 | Moisan | 427/305 |
| 4,759,952 | 7/1988 | Brasch | 427/306 |
| 4,761,303 | 8/1988 | Ruszezyk | 427/98 |
| 4,761,304 | 8/1988 | Brasch | 427/306 |
| 4,790,912 | 12/1988 | Holtzman | 427/306 |
| 4,847,114 | 7/1989 | Brasch | 427/306 |
| 4,931,148 | 6/1990 | Kukanskis | 427/98 |

FOREIGN PATENT DOCUMENTS

| | | |
|---|---|---|
| 0248522 | 12/1987 | European Pat. Off. . |
| 0287753 | 10/1988 | European Pat. Off. . |
| 0346655 | 12/1989 | European Pat. Off. . |
| 1523426 | 8/1978 | United Kingdom . |
| 1538163 | 1/1979 | United Kingdom . |
| 2013722 | 8/1979 | United Kingdom . |
| 2154251 | 9/1985 | United Kingdom . |
| 8500387 | 1/1985 | World Int. Prop. O. . |

*Primary Examiner*—Michael Lusignan
*Assistant Examiner*—Vi Duong Dang
*Attorney, Agent, or Firm*—John J. Tomaszewski; Kenneth A. Koch; Richard P. Mueller

[57] ABSTRACT

A method for making printed circuit boards wherein the resistance of catalyzed nonconductive surfaces to solutions used in the processing stages, e.g., KOH used to remove an etch resist covering through-holes and the desired circuit lines, is enhanced by treating the catalyzed surface with an accelerator to activate the catalyst, treating the accelerated surface with a reducing agent, followed by baking.

10 Claims, No Drawings

METHOD OF MAKING PRINTED CIRCUIT BOARDS

This is a continuation of copending application Ser. No. 07/345,804 filed on May 1, 1989, now abandoned.

BACKGROUND OF THE INVENTION

Printed circuit boards are well known industrial products and are used for a wide variety of commercial and consumer electronic applications such as in appliances, radios, machines, etc. Basically, the board contains a desired circuit configuration in the form of electrically conductive material "printed" onto the board. Boards having circuits on each face of the board are electrically interconnected between certain areas on the opposite faces by through-holes, which are drilled or punched in the desired configuration, and the walls coated with an electrically conductive material.

There are essentially two methods for preparing printed circuit boards (PCB's) one being termed the "subtractive" method and the other termed the "additive" method. Both methods are well known and are described in U.S. Pat. No. 4,233,344, which patent is hereby incorporated by reference. Basically, in the additive system, the starting board is comprised of plastic with no metal foil, and the metal circuit is then built up upon the nonconductive substrate in the desired pattern. In one of the subtractive methods, a nonconductive substrate, such as epoxy bonded fiberglass, has adhered to two sides thereof a metal cladding or laminate, most often copper. Holes are drilled through the copper laminate board exposing the plastic. It is then deburred, chemically cleaned and rinsed. The board is then treated for plating the through-holes by contacting with a dilute acid solution, dipped into a catalyst, most commonly an acidic palladium-tin catalyst, to activate the plastic for electroless deposits, rinsed in water, treated with an accelerator to activate the catalyst metal, again rinsed and immersed into an electroless plating bath to plate all catalyzed surfaces of the board including formation of a conductive coating on the inside of the through-hole to electrically connect the two metal (copper) sides. An etch resist is then applied over the unwanted copper areas in the circuit pattern desired. The board is then cleaned, electroplated with copper and coated with Sn/Pb. The etch resist is then removed with an appropriate solution (either solvent or alkaline solution) to expose the underlying foil and electroless copper thereon and this copper is removed by etching, thereby providing the desired circuit.

Regardless of the method for making printed circuit boards, the nonconductive portions of the substrate must be activated prior to metallization by either electroless or electrolytic metal plating. Unfortunately, it is not commercially feasible to treat only the nonconductive portions of the board and, as a result, the entire board is immersed or dipped into all the treating baths, including both the catalyst solution and the electroless plating bath.

To overcome the apparent waste of copper and other problems associated with prior art processes, newer methods electrolessly plate at the end of the PCB manufacturing process. These methods typically catalyze the drilled panel first and then utilize an etch resist (dry film type) over the desired circuit pattern, including tenting of the through holes, with the unwanted copper then being etched using ammoniacal copper chloride o ferric chloride. The etch resist is then removed and the board electrolessly plated, with the only portions plated being the circuit lines and the through-holes.

The use of an organic solvent soluble etch resist normally does not present a problem, unfortunately, however, removal of the etch resist using, e.g., alkaline solutions, removes the catalyst from the through-holes making the metal plating ineffective. This is a particularly serious problem when an environmentally preferred aqueous soluble etch resist is used since the commonly used KOH stripping solution readily removes the catalyst adsorbed on the through-hole wall.

It is an object of the subject invention to provide a method for treating a catalyzed nonconductive substrate to enhance its resistance to compositions used in the plating process. It is a further object of the present invention to provide an efficient and effective method for preparing a printed circuit board containing through-holes. Another object of the present invention is to provide printed circuit boards prepared by the novel method of the invention. These and other objects of the present invention will become readily apparent from the following detailed description.

SUMMARY OF THE INVENTION

It has now been found that the resistance of catalyzed nonconductive substrates to compositions used in plating processes and, in particular, compositions used to remove etch resists, e.g., solutions of KOH, may be enhanced by contacting the catalyzed substrate with an accelerator, treating the accelerated substrate with a reducing agent, followed by baking the treated substrate.

With regard to the preparation of printed circuit boards having through-holes which must be plated, a method comprises cleaning and pretreating a drilled copper foil clad board followed by:
  (a) catalyzing the board, including the through-holes, by immersion of the board in a catalyst composition, e.g., a conventional acidic palladium-tin catalyst;
  (b) accelerating the catalyzed board;
  (c) treating the accelerated board by immersing the board in a reducing composition;
  (d) baking the reduced board by heating at an effective elevated temperature
  (e) applying an etch resist over the desired circuit pattern and tenting the through-holes;
  (f) etching the exposed copper;
  (g) removing the resist using a suitable solvent;
  (h) electrolessly plating the board including the through-holes by immersing the treated board in a suitable electroless plating solution.

DESCRIPTION OF PREFERRED EMBODIMENTS

Any suitable plastic and/or reinforced plastic substrate may be treated by the method of the invention, e.g., acrylonitrile-butadiene-styrene, polystyrene, polycarbonate, etc. For convenience, the following description will be directed to copper laminated epoxy resin substrates which are the most commonly used plastic in the printed circuit board industry.

The pre-catalyst procedures for preparing the through-hole substrate, or for any plastic substrate, may vary widely depending on the article to be produced. In general, the copper clad substrate will be deburred, chemically cleaned and rinsed. For example, the panel may be treated with a cleaner for 5 minutes at 60° C. to 70° C. An exemplary cleaner is ENPLATE PC-475 sold by Enthone, Incorporated, West Haven, Conn. which cleaner contains cationic and non-ionic surfactants. After water rinsing, the board is then immersed in a copper etchant such as ENPLATE AD-485 which is of the peroxy sulphate type for 1–2 minutes at 20° C. to 25° C. The board is then water rinsed and immersed in 10% $H_2SO_4$ for 2 minutes at 20° C. to 25° C.

The substrate after drilling may be used as such or it may be treated using organic swellants and oxidants such as chromic acid, sulfuric acid, permanganate solutions and the like to enhance the adhesion of the metal plating. These treatments are discussed in U.S. Pat. No. 4,592,852, which patent is hereby incorporated by reference.

When the substrate is ready for catalysis, the substrate is immersed in the catalyst composition and the catalyst is adsorbed onto the substrate surface as is well known in the art. Any suitable catalyst may be employed and when the surface of the substrate is catalyzed using any of the commercially available mixed tin-palladium chloride catalyst solutions, various amounts of both tin and palladium are adsorbed on the substrate surface depending on the concentration and temperature of the catalyst, the time spent in the catalyst, and preconditioning treatment of the resin substrate. Usually increased temperature, longer immersion time and higher concentration of the catalyst solution tend to leave more catalyst on the surface of the resin substrate. There is a minimum amount of catalyst needed on the substrate surface in order to properly initiate electroless metal deposition to occur, and this minimum amount is usually achieved easily by immersing the substrate into the Sn/Pd catalyst solution under the given set of parameters specified by the suppliers of the commercial catalyst solutions. Exemplary catalysts are shown in U.S. Pat. No. 3,011,920, which patent is hereby incorporated by reference.

In general, a commercial acidic catalyst composition containing 100–250 mg/l palladium and 3–10 g/l tin will be used at a typical temperature of about 20° C. to 40° C. and an immersion time of 3 to 15 minutes. A commercial catalyst is ENPLATE ACTIVATOR-444 sold by Enthone.

The catalyzed substrate would then usually be treated with an accelerator or postactivator to enhance the plating step, followed by electroless plating. It is at this point after catalysis that the catalyzed substrate is contacted with an accelerator, and after acceleration, the accelerated substrate is treated with a reducing agent followed by baking to form a catalyzed surface which has enhanced resistant* to further processing compositions such as the KOH used in printed circuit board manufacture to remove the etch resist. A preferred accelerator is an acidic $H_2SO_4$ composition such as ENPLATE PA-493 sold by Enthone, Incorporated. The accelerators include ENPLATE PA 1889, an acidic fluoboric acid based composition, and ENPLATE PA 2748, an alkaline based composition. In general, an accelerator activates the catalyst and examples of suitable accelerators include dilute acids such as perchloric, $H_2SO_4$, phosphoric and alkaline materials such as NaOH, sodium carbonate, etc.

Any suitable reducing agent may be employed such as $C_1$-$C_4$ alkyl amine boranes and alkali metal borohydrides. Dimethylamine borane (DMAB), and particularly sodium borohydride are especially preferred because of their demonstrated effectiveness. In general, the catalyzed and accelerated surface is contacted with the reducing agent at a temperature of about 15 to 50° C. for 1 to 10 minutes. For DMAB, a concentration of 5 to 20 g/l and an adjusted pH of about 7 to 14, e.g., 11, at a temperature range of 21 to 44° C. for 5 to 15 minutes has been found to provide excellent results when used to treat epoxy boards catalyzed with a commercial tin-palladium catalyst and accelerated with an acidic accelerator at room temperature for 3–5 minutes. For sodium borohydride, a preferred concentration is about 1 to 5 g/l used at a temperature of 20° to 30° C. for 3 to 8 minutes.

The treated catalyzed substrate is then heated at a temperature up to the softening temperature of the substrate, e.g., preferably about 60° C. to 150° C. and more preferably 130° C. to 150° C. for up to, for example, 60 minutes.

Once the catalyzed substrate is treated according to the invention, the preparation of the printed circuit board is continued using any of a variety of known techniques.

In one embodiment, after applying an aqueous dry film strippable etch resist over the desired circuit and tenting the through-holes, the unwanted copper is etched using ammoniacal cupric chloride, ferric chloride, etc. This is followed by removing the etch resist using an aqueous solution of KOH. Exemplary of this etching resist is RISTON 3800 and 4200 sold by DuPont. The KOH solution is generally about 2–2.5 weight % KOH and the board is treated by spraying or by immersion in the solution for about 30 seconds to 2 minutes at 50° C. to 60° C.

After removal of the resist, the board is ready for electroless plating using any of the well-known plating compositions. Exemplary compositions may be found in U.S. Pat. Nos. 3,698,940 and 3,976,816. The plated board may then be prepared for use by any other known method.

In order to further illustrate the present invention, the following examples are set forth.

A series of drilled double sided copper clad epoxy printed circuit board panels 18 inch × 24 inch were prepared for plating using the following procedure:

(1) permanganate desmear by immersing for 5/10/5 minutes and 60°–71° C./71°–82° C./54°–66° C. respectively in ENPLATE MLB-495[a], ENPLATE MLB-497[b] and ENPLATE MLB-498[c];
(2) immerse in ENPLATE PC-475 at 40° C. for 5 minutes;
(3) rinse in cold water;
(4) immerse in ENPLATE AD-485 at 20°–25° C. for 2 minutes;
(5) rinse in cold water;
(6) immerse in 10% $H_2SO_4$ at room temperature for 1 minute;
(7) rinse in cold water;
(8) immerse in ENPLATE PC-236[d] at 20°–25° C. for 1 minute;
(9) immerse in ENPLATE ACT-444 at 38° C. for 10 minutes;
(10) rinse in cold water.

a Alkaline aqueous-solvent (glycol-ether) solution to condition the substrate. b Alkaline permanganate solution having a pH of 13–14. c Neutralizer solution containing an amine type reducing agent. d NaCl-HCl pre-dip solution

EXAMPLE I

A number of the above panels were processed by the following steps:
1. immerse in accelerator ENPLATE PA-493 at room temperature for 4 minutes;
2. immerse in a 10 g/l DMAB (Dimethylamine borane) solution (pH 11) for 5 minutes at room temperature;
3. dry;
4. heat for 30–40 minutes at 132° C.;
5. let cool to room temperature;
6. immerse in a 2.25 weight % KOH solution for 1 minute at 60° C. (to simulate the etch resist stripping step);
7. immerse in ENPLATE PC-455$^e$ for 5 minutes at 60° C.;
8. immerse in ENPLATE AD-485 for 2 minutes at 20°–25° C.;
9. immerse in ENPLATE PA-493 for 4 minutes at room temperature.
10. plate with ENPLATE CU-9011$^f$ for 12–16 hours at 60° C.

e Non-ionic surfactant cleaner composition. f Electroless copper sulphate plating solution containing 1–2 g/l copper complexed with ethylene diamine tetraacetic acid using formaldehyde as the reducing agent and having a pH of about 12.5.

The plating substantially covered the through-holes.

EXAMPLE II

EXAMPLE I was repeated except that the DMAB step was replaced using a 2 g/l NaBH$_4$ solution for 5 minutes at room temperature. The plating substantially covered the holes.

COMPARATIVE EXAMPLE I

EXAMPLE II was repeated except that the postactivation step (1) was omitted. Metallization of the holes was incomplete.

COMPARATIVE EXAMPLE II

EXAMPLES I and II were repeated except that reducing step (2) was not performed. The hole metallization was incomplete.

The same experiment without reducing step (2) and heating step (4) provided incomplete hole metallization.

COMPARATIVE EXAMPLE III

EXAMPLE I was repeated except that step (1) - immersion in the ENPLATE PA-493 post-acvtivation was omitted. The hole metallization was incomplete.

Similarly, EXAMPLE I was repeated except that step (1) and the heating step (4) was omitted. The hole metallization was incomplete.

COMPARATIVE EXAMPLE IV

EXAMPLE I was repeated except that both steps (1) post-activation and (2) reduction, were omitted. Only trace metal plating was obtained. Similarly, when heating step (4) was also omitted only trace metal plating was obtained.

It will be apparent that many changes and modifications of the several features described herein may be made without departing from the spirit and scope of the invention. It is therefore apparent that the foregoing description is by way of illustration of the invention rather than limitation of the invention.

I claim:

1. In a method for treating nonconductive plastic surfaces to enable electroless or electrolytic metal plating thereof comprising treating the surface with a catalyst to render the surface catalytic toward the plating followed by treating the catalyzed surface with an accelerator to activate the catalyst and then plating the plastic the improvement for enhancing the resistance of the catalyzed surface to stripping solutions used in the plating process comprising after the accelerating step treating the accelerated surface with a reducing agent and then heating the treated surface for an effective time at an elevated temperature prior to the metal plating.

2. The method of claim 1 wherein the reducing agent is selected from the group consisting of alkylamine boranes and alkali metal borohydrides.

3. The method of claim 1 wherein the plastic surface is catalyzed using an acidic palladium-tin catalyst.

4. The method of claim 3 wherein the reducing agent is selected from the group consisting of DMAB and sodium borohydride.

5. The method of claim 4 wherein the accelerator is an acidic solution.

6. A method for preparing a printed circuit board by metal plating from a copper laminated substrate containing through-holes comprising:
   (a) catalyzing the board, including the through-holes, by immersion of the board in a catalyst composition to render the surface catalytic to electroless plating;
   (b) accelerating the catalyzed board;
   (c) treating the accelerated board by immersing the board in a reducing composition;
   (d) baking the reduced board for an effective time at an elevated temperature, steps (c) and (d) enhancing the resistance of the catalyzed surface to stripping solutions used in the plating process;
   (e) applying an etch resist over the desired circuit pattern and tenting the through-holes;
   (f) etching the exposed copper;
   (g) removing the etch resist using a suitable solvent;
   (h) electrolessly plating the board including the through-holes by immersing the treated board in a suitable electroless plating solution.

7. The method of claim 6 wherein the catalyst is an acidic palladium-tin composition.

8. The method of claim 7 wherein the reducing composition is selection from the group consisting of DMAB and sodium borohydride.

9. The method of claim 8 wherein the reducing composition is a 10 g/l DMAB aqueous solution having a pH of about 11.

10. The method of claim 6 wherein the printed circuit board is made using an electrolytic plating bath.

* * * * *